United States Patent
Kubo et al.

(10) Patent No.: US 6,907,085 B2
(45) Date of Patent: Jun. 14, 2005

(54) ACTIVATION METHOD OF COMMUNICATIONS APPARATUS WITH A NON-LINEAR DISTORTION COMPENSATION DEVICE

(75) Inventors: Tokuro Kubo, Kawasaki (JP); Takayoshi Ode, Kawasaki (JP); Kazuo Nagatani, Kawasaki (JP); Hajime Hamada, Kawasaki (JP); Hiroyoshi Ishikawa, Kawasaki (JP); Yasuyuki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 729 days.

(21) Appl. No.: 09/805,870

(22) Filed: Mar. 14, 2001

(65) Prior Publication Data

US 2001/0051504 A1 Dec. 13, 2001

(30) Foreign Application Priority Data

Jun. 6, 2000 (JP) ........................................ 2000-168844

(51) Int. Cl.[7] ............................................... H04B 15/00
(52) U.S. Cl. ....................... 375/285; 375/297; 332/124; 332/160; 332/162; 455/63; 455/67.3
(58) Field of Search ................................. 375/295–298, 375/285; 332/107, 123–125, 159, 1, 160, 162, 126; 455/43, 50.1, 63, 67.3, 115, 126

(56) References Cited

U.S. PATENT DOCUMENTS 5,959,499 A * 9/1999 Khan et al. .................. 330/149
6,275,685 B1 * 8/2001 Wessel et al. ............... 455/126
6,697,436 B1 * 2/2004 Wright et al. ............... 375/296

FOREIGN PATENT DOCUMENTS

| JP | 6-54006 | 2/1994 |
| JP | 9-153849 | 6/1997 |

* cited by examiner

*Primary Examiner*—Dac V. Ha
(74) *Attorney, Agent, or Firm*—Katten Muchin Zavis Rosenman

(57) ABSTRACT

First, a digital section constituting a linearizer is activated. Then, a feedback loop for updating a distortion compensation coefficient is opened. Then, the analog section on the antenna side is activated from an ADC, including a PA, etc., or a DAC. Then, both the ATT value of an ATT installed in a feedback route for updating the distortion compensation coefficient and the signal delay amount of a signal delay unit are adjusted to make a state such that the distortion compensation coefficient can be accurately updated. Then, the feedback loop is closed, a distortion compensation table having the distortion compensation coefficient as an entry is generated and after the generation is completed, the operation shifts to the normal operation.

15 Claims, 17 Drawing Sheets

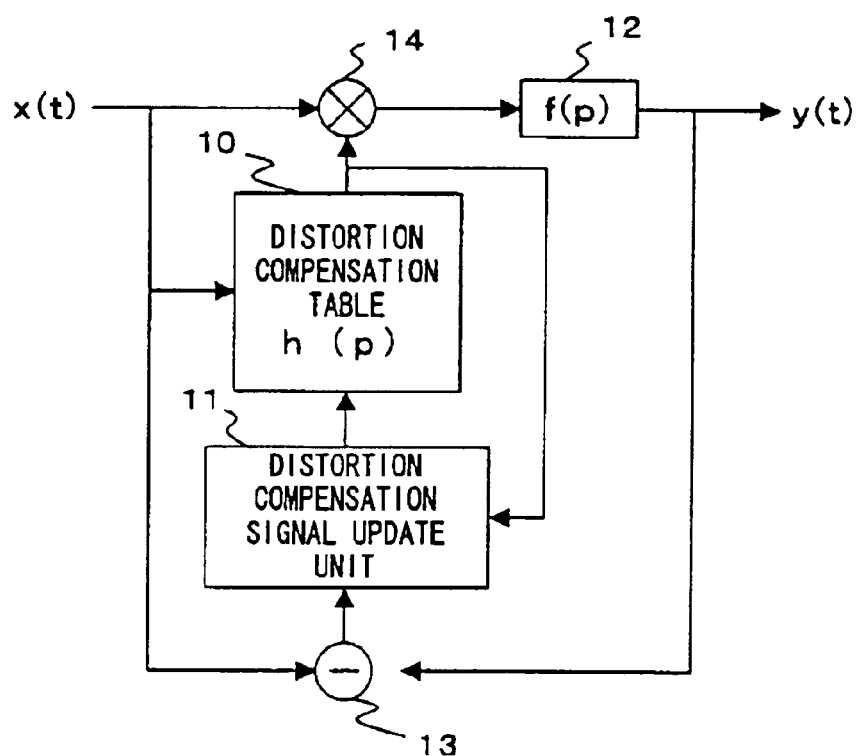
F I G. 1

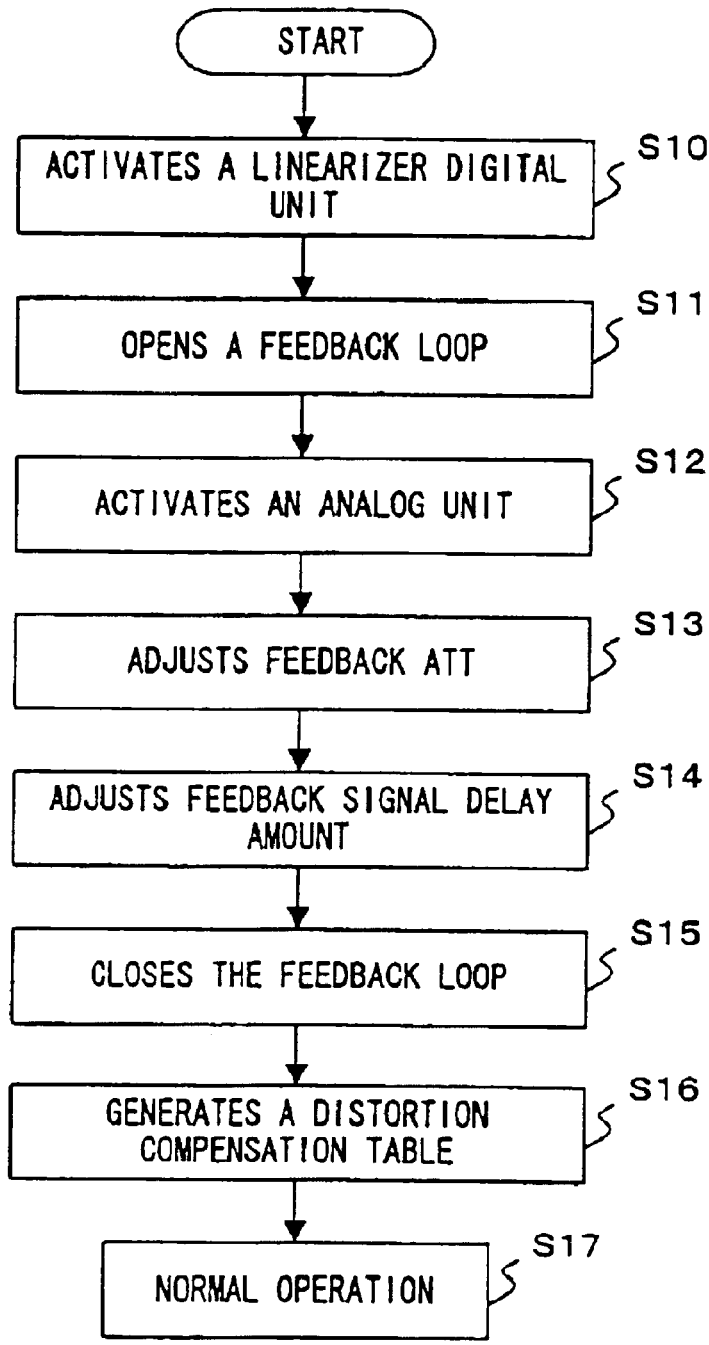
F I G. 3

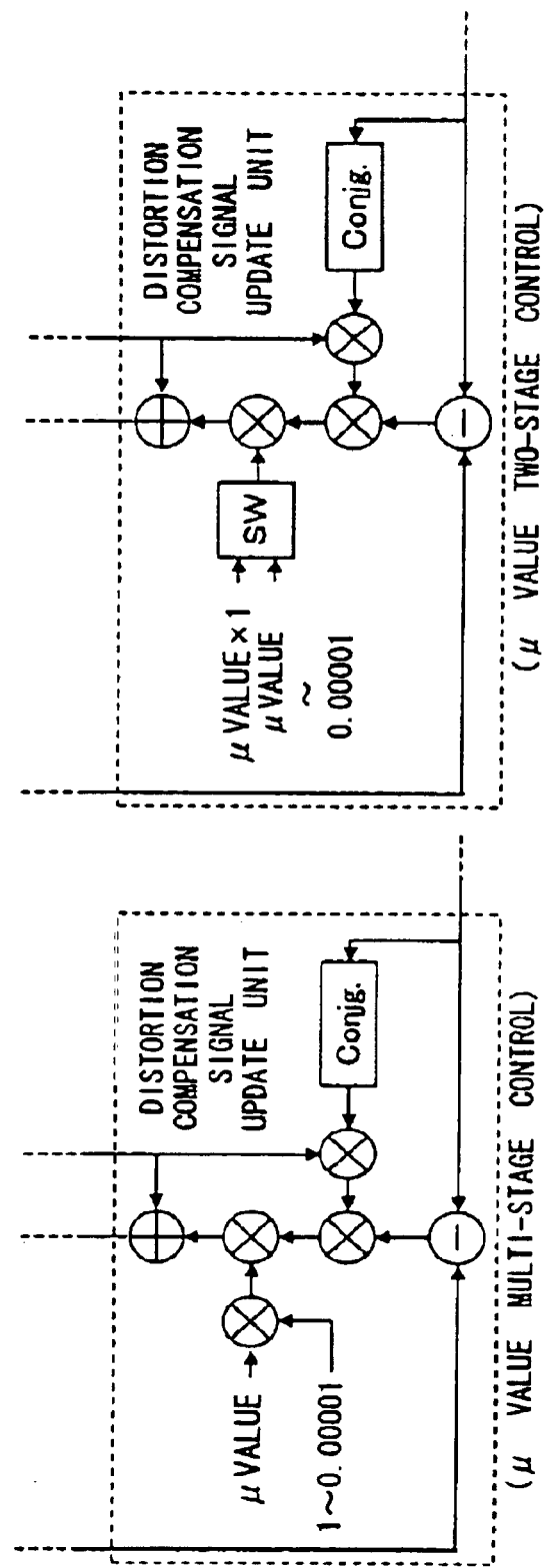

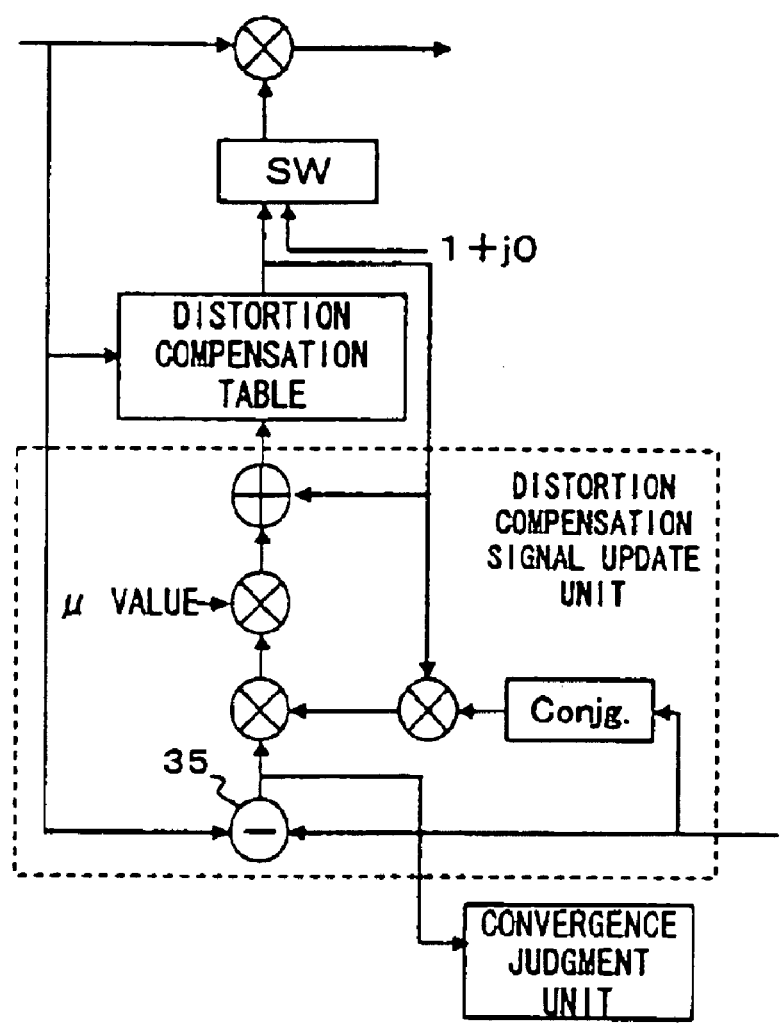
F I G. 1 4

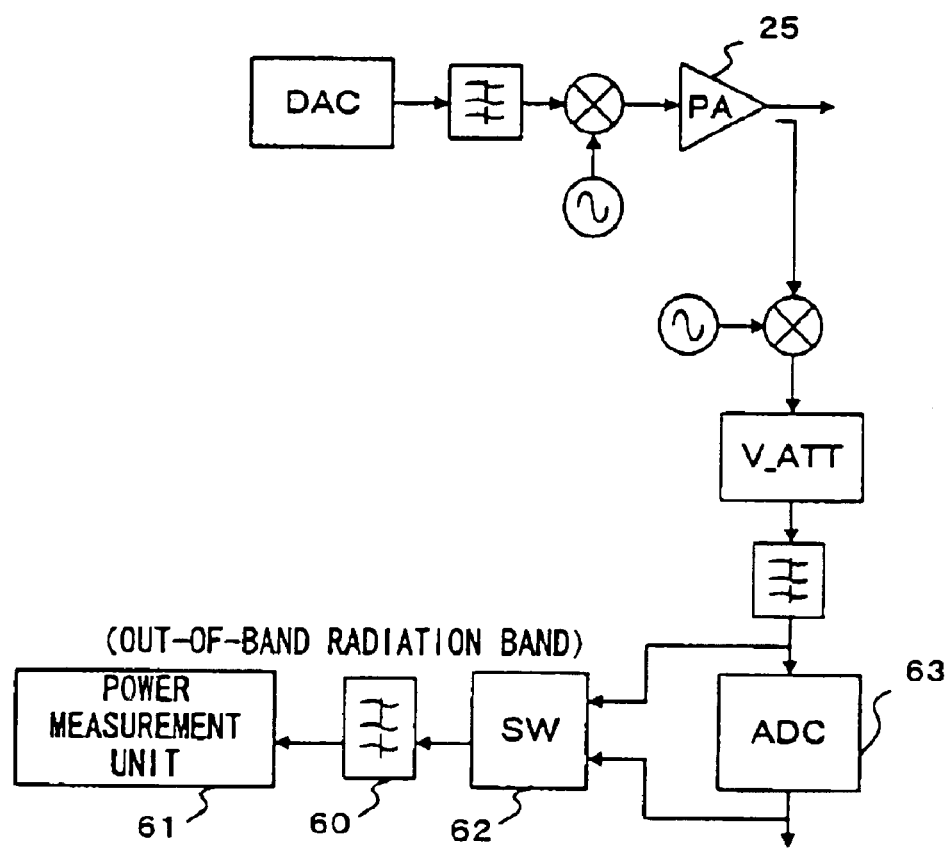
F I G. 15

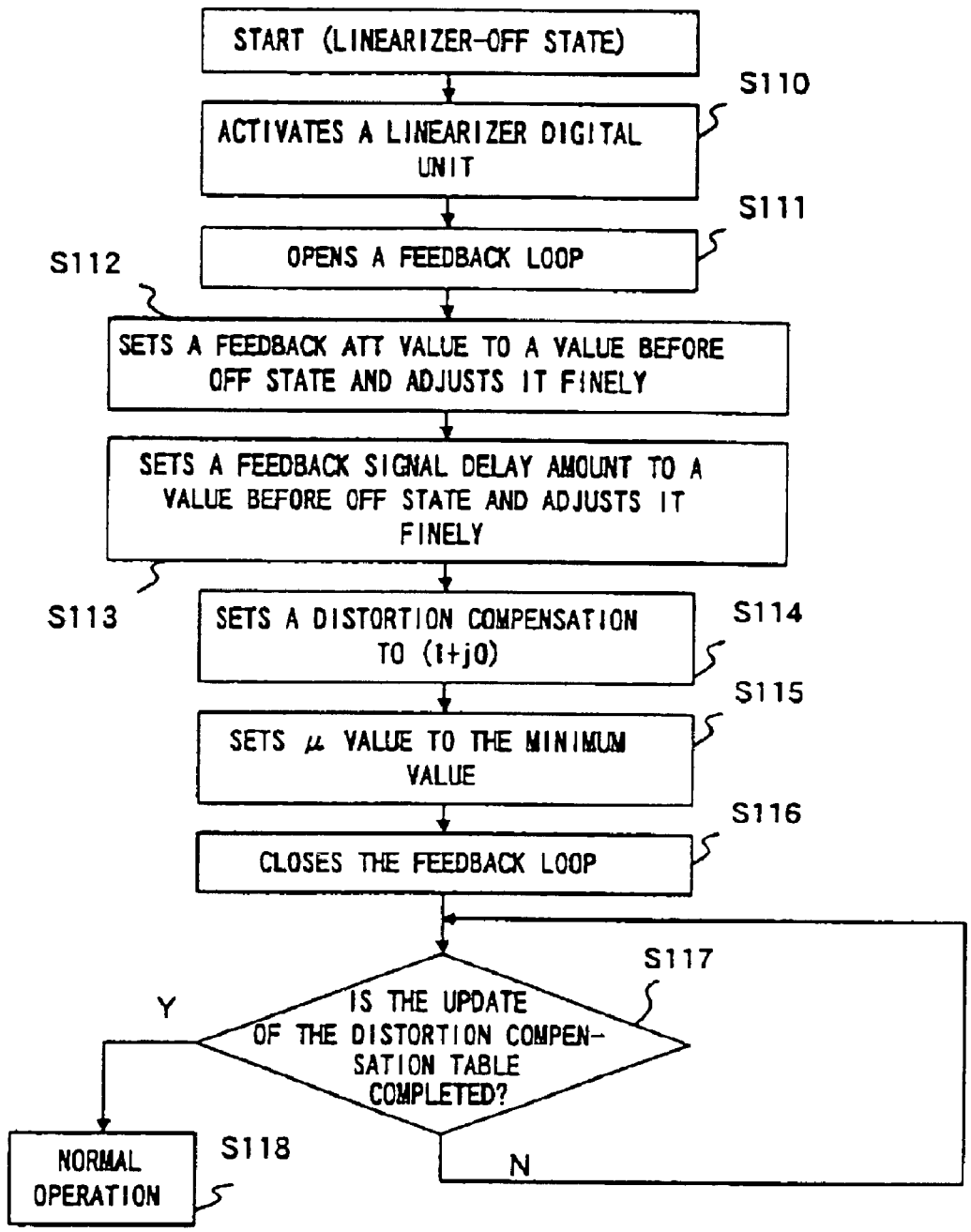
F I G. 1 6

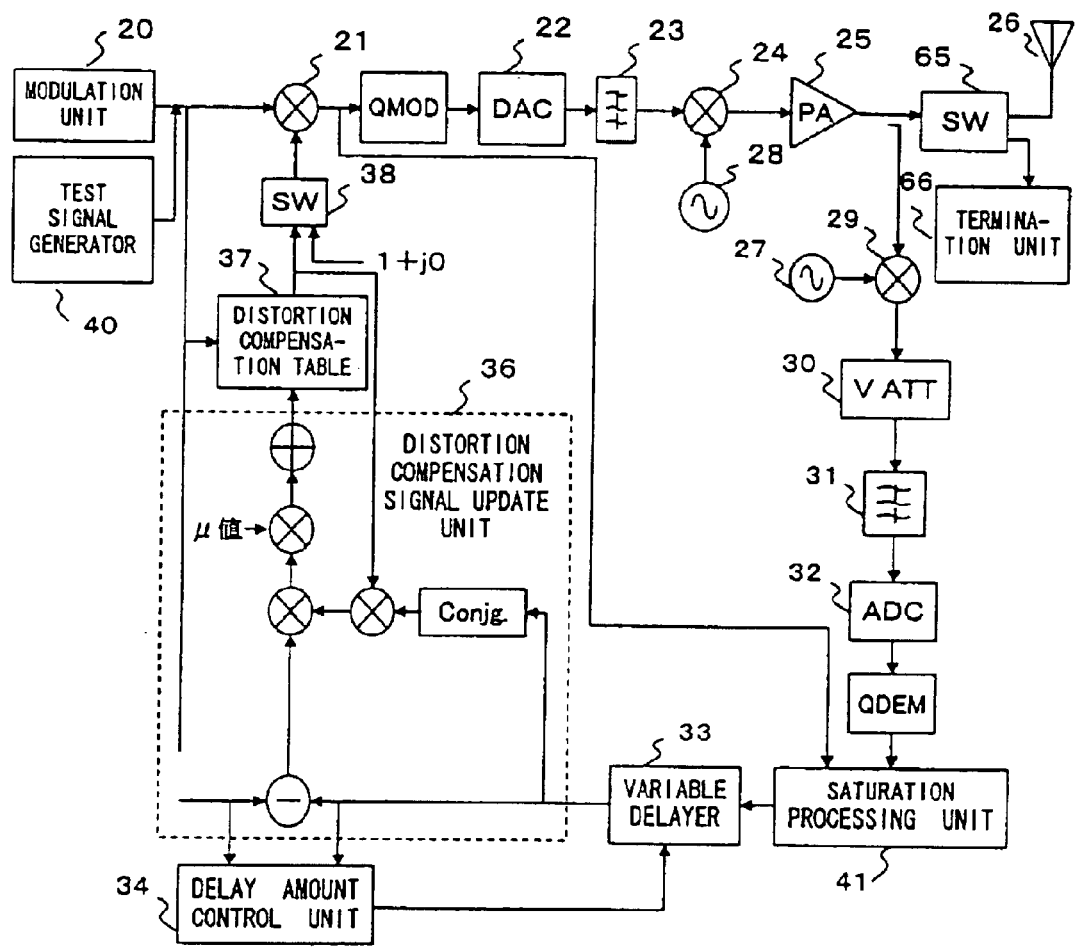
F I G. 1 7

ACTIVATION METHOD OF COMMUNICATIONS APPARATUS WITH A NON-LINEAR DISTORTION COMPENSATION DEVICE

BACKGROUND OF THE INVENTION

1. Field of the Invention

The present invention relates to an activation method of each part of a communications apparatus with a distortion compensation device (or linearizer).

2. Description of the Related Art

Recently many pieces of radio equipment adopting a linear modulation method with a high frequency utilization efficiency, such as QPSK, etc., have been used. In this case, high linearity is also required by a transmitting unit for transmitting radio waves. If high linearity is required in the power amplifier (PA) installed at the final stage of the transmitting unit, contrarily efficiency degrades, and the requirements on the size, power capacity, radiation, etc., of an amplifier become severe. Specifically, since the use of a power amplifier with a wide power range indicating high linearity inevitably leads to a large PA, power consumption increases and efficiency degrades. Therefore, both high power efficiency and linearity are obtained by using an amplifier with a pretty small power range indicating low linearity in a non-linear range and by linearizing the non-linear area of the small amplifier by a non-linear distortion compensation circuit.

However, there are currently very few commercialization of a transmitting device with sufficient non-linear distortion compensation device (linearizer, in particular a predistortor type linearizer for improving virtual linearity between the input and obtained output of a PA by multiplying the PA input by updateable compensation coefficient and inputting the result to the PA) nor any activation procedure has not been established.

Since a transmitting device with a linearizer must generate many adjustment points and compensation tables compared with a transmitting device without a linearizer, a more complex procedure is required when it is actually activated.

There are conventionally few commercialization of a transmitting device with a sufficient linearizer and it cannot be said that a technology required to control such a device is sufficiently developed. In particular, although in a wideband-CDMA (W-CDMA), the commercialization of which is widely researched and developed, it is considered that a wideband signal is transmitted with high power, it is simultaneously desired that such a device is configured using the small PA described above in order to avoid the large size and high power consumption of the device. Therefore, it can be expected that a transmitting device with a linearizer will be a main stream device in the future. Therefore, in such a transmitting device with a linearizer, a technology, such as a control method of each part, etc., must be sufficiently developed. Since in a transmitting device with a linearizer, many adjustment points and compensation tables must be generated compared with an ordinary transmitting device, the device must be activated by an accurate procedure.

SUMMARY OF THE INVENTION

It is an object of the present invention to provide an appropriate activation method in communications apparatus with a linearizer having a function to generate/update a distortion coefficient.

The activation method of the present invention is for communications apparatus that has both a feedback loop and a non-linear distortion compensation device with a function to generate/update a distortion compensation coefficient. The method comprises the steps of (a) opening the feedback loop, (b) performing the level adjustment and phase adjustment of an analog signal of the communications apparatus, (c) closing the feedback loop and (d) generating/updating the distortion compensation coefficient.

According to the present invention, a communications apparatus with a linearizer (non-distortion compensation device) that has both a feedback loop and a function to generate/update a distortion compensation coefficient, can be provided with an appropriate activation method.

BRIEF DESCRIPTION OF THE DRAWINGS

FIG. 1 shows the basic configuration of a linearizer.

FIG. 3 is a flowchart showing the activation procedure of the basic configuration shown in FIG. 2.

FIG. 12 shows one configuration for making $\mu$ value variable, which is the update step of a distortion compensation coefficient.

FIG. 14 shows the initial setting of the convergence judgment of a distortion compensation coefficient.

FIG. 15 shows the initial setting of another convergence judgment of a distortion compensation coefficient.

FIG. 16 is a flowchart showing a procedure of activating a linearizer from a linearizer-off state.

FIG. 17 shows the configuration in the case where a linearizer is applied to a mobile station.

DESCRIPTION OF THE PREFERRED EMBODIMENTS

The preferred embodiment of the present invention assumes a transmitting device with both a feedback circuit and a predistortor type linearizer for updating a distortion compensation coefficient.

Prior to the normal operation of a linearizer, the following items must be performed.

(1) Adjustment of a value for designating the attenuation amount of a feedback attenuator (ATT)
(2) Adjustment of a feedback signal delay amount (signal delay amount caused by a PA, a filter, etc., in analog processes Both (1) and (2) must be adjusted at the open state of the feedback loop, and without such adjustment, an accurate distortion compensation coefficient used to perform a pre-distortion cannot be generated. Specifically, if both (1) and (2) are performed in the close state of a feedback loop, the distortion compensation coefficient is updated with the change of a signal transmitted through a feedback loop generated by the adjustment of both (1) and (2). Therefore, the adjustments of both (1) and (2) cannot be successfully made.

FIG. 1 shows the basic configuration of a linearizer.

Figure 2:
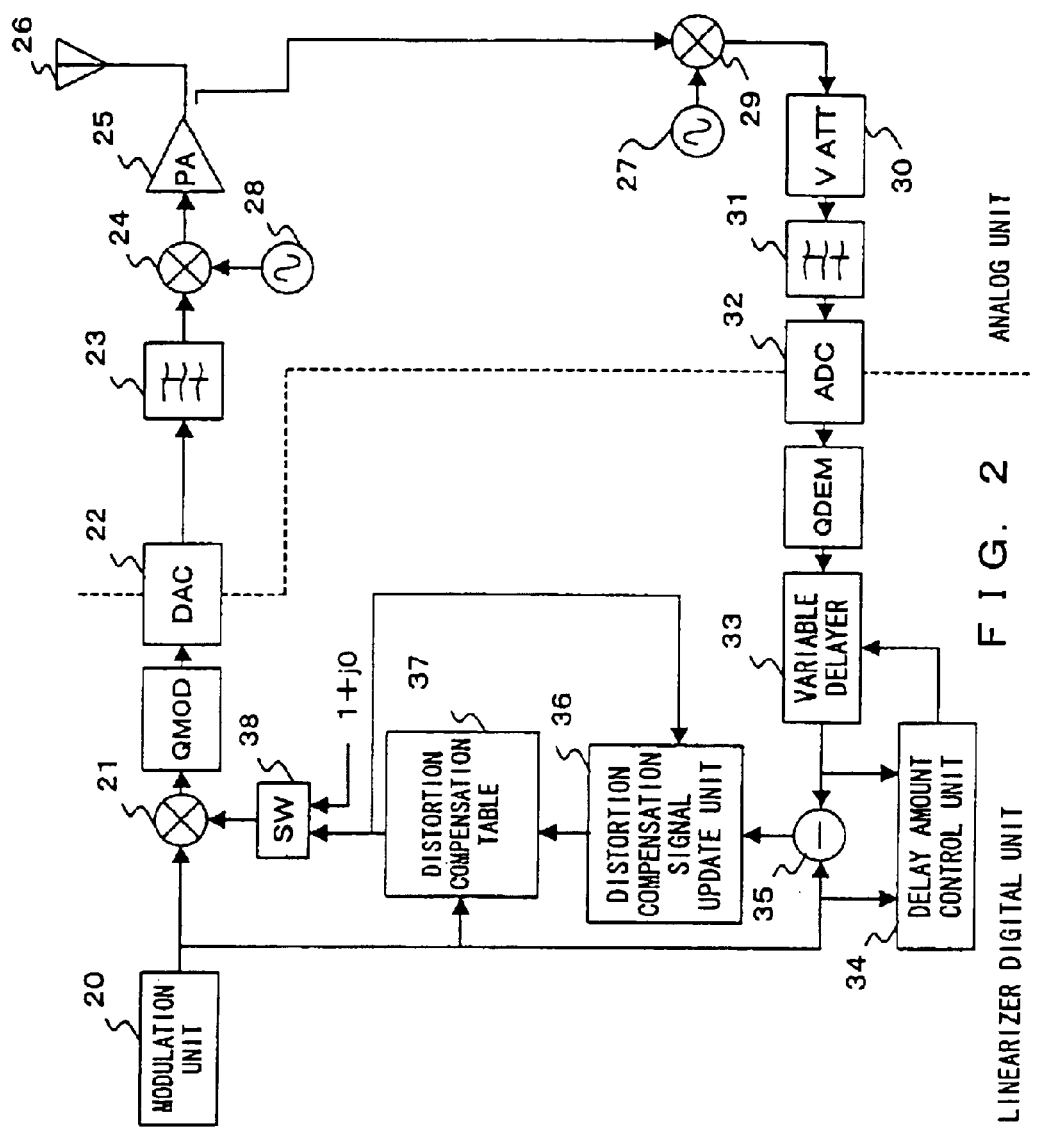
FIG. 2 shows the configuration of the transmitting device, to which the basic procedure of the activation method in the preferred embodiment of the present invention is applied.

FIG. 1 shows the basic configuration of a predistortor type linearizer with a feedback loop circuit, for updating a distortion compensation coefficient. FIG. 2 shows the transmitting device, to which the basic procedure of the activation method in the preferred embodiment of the present invention, is applied.

If, as shown in FIG. 1, it is assumed that the input to a predistortor type linearizer is x(t), this x(t) is inputted to both a subtracter 13 and a distortion compensation table 10. The subtracter 13 subtracts a signal obtained by power-adjusting the output from the PA12 from x(t) and inputs the balance to a distortion compensation signal update unit 11. Output value h(p) from the distortion compensation table 10 is also inputted to the distortion compensation signal update unit 11, and by properly multiplying h(p) by the difference signal from the subtracter 13, an entry update signal of the distortion compensation table 10 can be obtained.

x(t) is inputted to the distortion compensation table 10 as an address value for obtaining entry to the distortion compensation table 10 and if the entry to the distortion compensation table 10 is updated, it also makes an address value for indicating an entry to be updated.

Distortion compensation coefficient h(p) outputted from the distortion compensation table 10 is multiplied by x(t) in a multiplier 14, and the multiplication result of h(p) and x(t) is inputted to the PA12 with gain f(p). The output y(t) of the PA12 is transmitted to a circuit installed at a later stage and is also inputted to the subtracter 13 via a feedback route. Although as described later, the feedback route comprises an attenuator, etc., for properly attenuating the output y(t) of the PA12, it is omitted in FIG. 1.

FIG. 2 shows the basic configuration of the transmitting device, which is configured based on the principle shown in FIG. 1 and to which the activation method of the present invention is applied. In FIG. 2, a modulation signal outputted from a modulation unit 20 is inputted to a multiplier 21, a distortion compensation table 37 and a subtracter 35. A switch 38 is used to determine whether a signal to be multiplied to the modulation signal is a value obtained from a distortion compensation table 37 or 1+j0 (j is the imaginary unit) in the multiplier 21. Although in FIG. 2 it is described as if a signal were transmitted via a single route, actually, each signal consists of I signal and Q signal, each of the signals is wired and the signals are regarded as one complex signal. Therefore, it is assumed that a complex signal is transferred in the circuit shown in FIG. 2. Therefore, multiplying the complex modulation signal from the modulation unit 20 by 1+j0 in the multiplier 21 leads to the fact that there is no influence on the complex modulation signal. Therefore, by selecting 1+j0 in the switch 38 and inputting it to the multiplier 21, a feedback loop for updating a distortion compensation coefficient can be opened. If in the switch 38 the value from the distortion compensation table 37 is inputted to the multiplier 21, the distortion compensation coefficient is multiplied to the complex modulation signal from the modulation unit 20, specifically the feedback loop is closed. Since a modulation signal is a complex signal, a distortion compensation coefficient is a complex value in this preferred embodiment.

After being QPSK-modulated, the output from the multiplier 21 is converted into an analog signal by a digital/analog converter (DAC) 22. Then, the output is passed through a bandpass filter 23, is multiplied by a high frequency from a local oscillator 28 in a multiplier 24 and is converted into an RF signal. The RF signal obtained in this way is amplified by a PA 25 and is transmitted from an antenna 26.

The output from the PA 25 is inputted to a multiplier 29 via a feedback route, is multiplied by a high frequency from a local oscillator 27 and is inverted into a low frequency modulation signal from a RF signal. Then, the power increase amplified by the PA 25 is attenuated by a variable attenuator (VATT) 30. The VATT 30 detects the power value in the switch 38e of the complex modulation signal and attenuates the power while neglecting a phase shift provided by the PA 25. In this way, the attenuated complex modulation signal is passed through a bandpass filter 31, is converted into a digital signal by an analog/digital converter (ADC) and is inputted to a variable delayer 33 after being QPSK-modulated.

The variable delayer 33 adjusts the delay amount of the modulation signal inputted to the delayer via a feedback route based on the analog difference in delay between the modulation signal directly transferred from the modulation unit 20 that is detected by a delay amount control unit 34 and the modulation signal inputted via a feedback route so that subtraction can be correctly conducted in a subtracter 35. In this case, the variable delayer 33 is used to adjust an analog delay amount provided to a modulation signal by a filter or the PA 25. It is assumed that full digital delay with the accuracy of a master clock that is generated by an FF, etc., is already adjusted although the delayer is not shown in FIG. 2.

If the difference signal is inputted to a distortion compensation signal update unit 36 from the subtracter 35, the update of the distortion compensation table is indexed and a distortion compensation coefficient is outputted to the switch 38, as shown in FIG. 1.

In the description of the preferred embodiment of the present invention, as shown by a dotted line in FIG. 2, one side, including the DAC 22, ADC 23 and antenna 26 is called an analog section, and the other side, including the modulation unit 20 is called a linearizer digital section.

FIG. 3 is a flowchart showing the activation procedure of the basic configuration shown in FIG. 2. FIG. 3 shows the basic activation procedure of the preferred embodiment of the present invention.

First, prior to the switch-on of the power amplifier (PA) installed at the final stage, the linearizer digital section is activated (step S10) to open a feedback loop (step S11). For example, the feedback loop can be opened by using 1+j0 as a multiplication coefficient instead of inputting a distortion compensation coefficient to a complex multiplier for pre-distorting a signal from a modulator and by not operating the distortion compensation update unit.

Then, the analog section, including a PA is activated (step S12) to make a feedback signal attenuator (VATT 30 shown in FIG. 2) adjust the levels of both a reference signal (a signal directly inputted to the attenuator 35 from the modulator 20) and a feedback signal (signal obtained from the output of the PA 25). Then, in order to match the relative timing of both the feedback signal and reference signal, the variable delayer 33 shown in FIG. 2 makes timing adjustment (step S14). After the adjustment in steps S13 and S14 is completed, the feedback loop is closed (step S15) and a distortion compensation coefficient (table) is generated (step S16). After the activation procedure described above, a normal linearization is performed (step S17).

In the procedure shown in FIG. 3 it is assumed that radio waves are not transmitted from an antenna and are terminated at a signal termination unit with the same impedance as that of the antenna.

Figure 4:
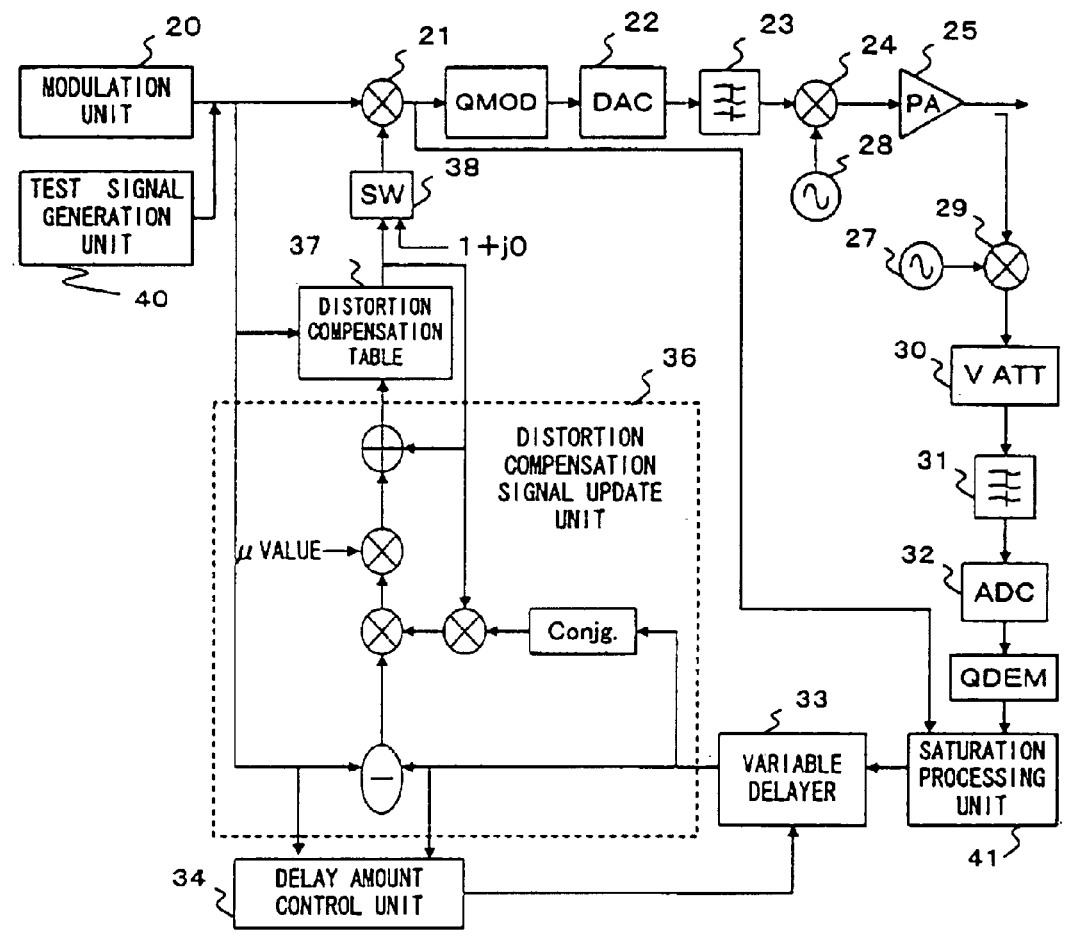
FIG. 4 shows the configuration of the base station transmitting unit, to which the preferred embodiment of the present invention is applied.

FIG. 4 shows the configuration of the base station transmitting unit, to which the preferred embodiment of the present invention is applied.

In FIG. 4, the same reference numbers are used for the same constituent elements as those shown in FIG. 2 and the descriptions are omitted here.

The test signal generator unit 40 shown in FIG. 4 is used to generate a distortion compensation table 37. If a modulation signal from the modulation unit 20 is used to generate the distortion compensation table 37, sometimes the power of the modulation signal is restricted within a prescribed range and a distortion compensation coefficient cannot be generated for all the power values that the distortion compensation table 37 can store. Therefore, the test signal generator 40 is configured to generate a test signal for all the power values covering the distortion compensation table 37, and a distortion compensation table can also be generated for both a very low power portion and a very high power portion.

The PA 25 is configured in such a way that output power can be saturated if input power becomes high. Specifically, even if an input signal with very high power is inputted, output power cannot become high. In this case, if nothing is done, the distortion compensation signal update unit 36 tries to correct a distortion compensation coefficient to obtain sufficient linearity. However, this correction is not converged and the compensation coefficient reaches the maximum possible digital bit value. As a result, a transmitting signal waveform after distortion compensation is discontinued and the signal distortion further increases. Therefore, on receipt of the input signal of the DAC that has already sufficiently high power, a saturation processing unit 41 estimates that the PA 25 will be saturated, amplifies the power of the feedback signal from the PA 25, inputs the signal to the distortion compensation signal update unit 36 and enables the distortion compensation signal update unit 36 to judge that sufficient linearity is obtained and to control not to further correct the distortion compensation coefficient.

Figure 5:
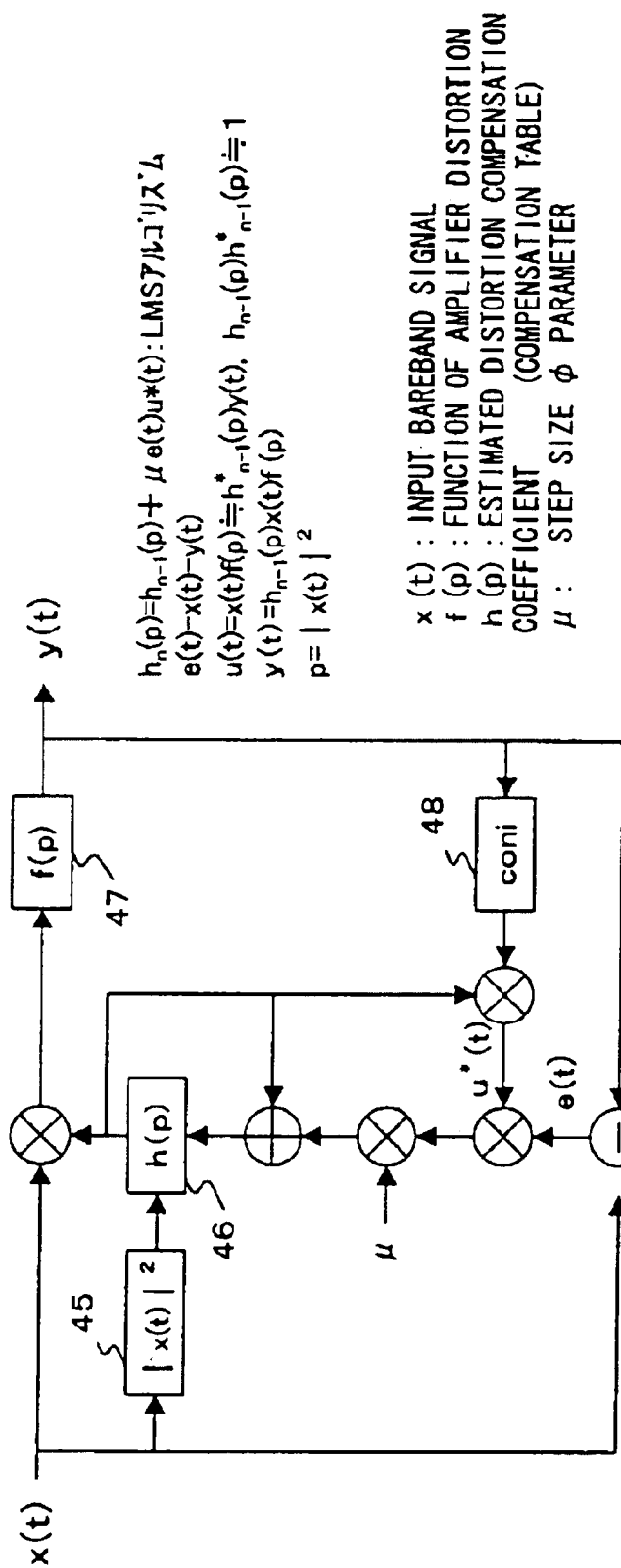
FIG. 5 shows both the configuration and operation of an adaptive predistortor type linearizer shown in this preferred embodiment.

FIG. 5 shows both the configuration and operation of the adaptive predistortor type linearizer shown in this preferred embodiment.

An adaptive predistortor type linearizer estimates the non-linear distortion of an amplifier using an adaptive algorithm and performs predistortion in a digital process to compensate for distortion. Since distortion is the non-linear function of input amplitude, independent distortion is estimated for each quantized input value and a correction value such that the mean square error of a signal obtained by adjusting the level of an amplifier output signal and the reference signal is calculated, using the adaptive algorithm.

For an MMSE algorithm for minimizing the mean square error, a stable method of least squares (LMS) with the least operation amount is used in this type of linearizer.

The absolute value of x(t) being a complex signal is squared in a block 45 to make an index or address value p for indexing the entry h(p) of a distortion compensation table 46. x(t) is multiplied by a distortion compensation coefficient before update $h_{n-1}(p)$ and is amplified by a PA47 to make y(t). After the level of y(t) is adjusted, y(t) is inputted to a subtracter, which is not shown in FIG. 5, is subtracted from x(t), that is, e(t)=x(t)−y(t). The complex conjugate of y(t) is calculated in a block 48, and y*(t) is multiplied by $h_{n-1}(p)$ to make u*(t). In this case, superscript "*" indicates a complex conjugate. Then, the correction value of the distortion compensation is calculated by multiplying e(t) by u*(t), further multiplying the result by $\mu$ and adding $h_{n-1}(p)$ to the new result.

Figure 6:
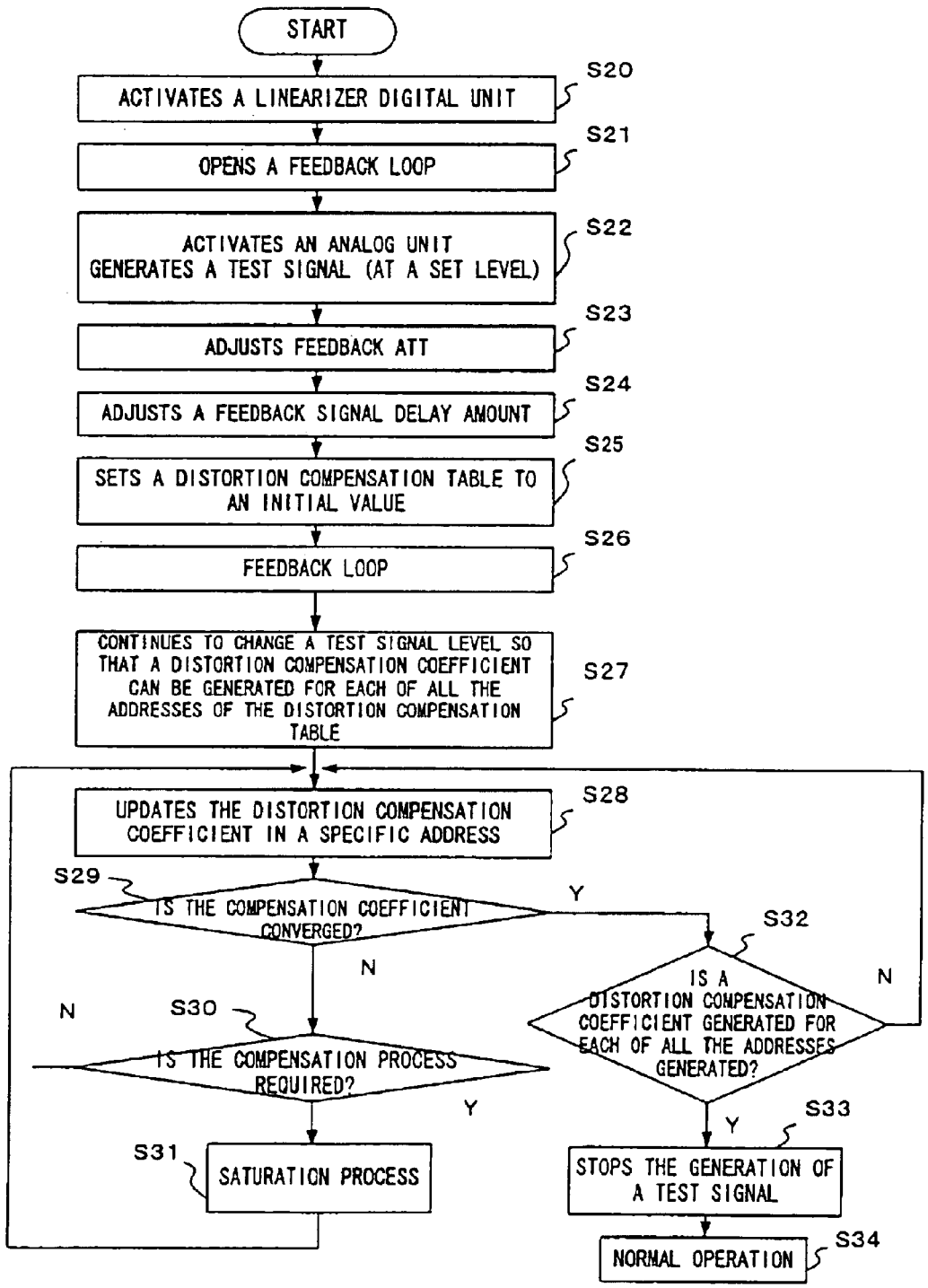
FIG. 6 is a flowchart showing the activation procedure of the transmitting device shown in FIG. 4.

FIG. 6 is a flowchart showing the activation procedure of the transmitting device shown in FIG. 4.

In FIG. 6, as in the case of FIG. 3, first, a linearizer digital section is activated (step S20). Then, after a feedback loop is opened (step S21), an analog section, including a PA is activated (step S22) However, in this case, not a normal modulation signal, but a test signal for making the adjustment of both a feedback ATT and a feedback signal delay amount easy to make is used as a signal. After the adjustment of both the feedback ATT and feedback signal delay amount (steps S23 and S24), a distortion compensation table is generated. However, in this case, a compensation coefficient is generated by making the test signal level variable so that a compensation coefficient can be generated for every address of the distortion compensation table (step S27).

In the generation of the compensation coefficient, a distortion coefficient is updated in a specific address of the distortion compensation table (step S28), and in step S29 it is judged whether the compensation coefficient is converged. If it is judged that the compensation coefficient is not converged, in step S30 it is judged whether a saturation process is required (a saturation process is an operation of restricting amplitude if it is controlled in such a way that a signal after predistortion exceeds the output limit of a DAC or the output of the PA is saturated, and making a phase follow amplitude if amplitude is restricted). If the saturation process is not required, the flow returns to step S28. If it is judged that the saturation is required, in step S31 a saturation process is performed and the flow returns to step S28.

If in step S29 it is judged that the compensation coefficient is converged, in step S32 it is judged whether a distortion compensation coefficient is generated for every address of the distortion compensation table. If in step S32 it is judged that a coefficient is not generated for every address, the flow returns to step S28. If in step S32 it is judged that a coefficient is generated for every address, in step S33, the generation of the test signal is stopped and in step S34, the operation shifts to the normal operation.

In the activation procedure shown in FIG. 6 too, a signal termination unit with the same impedance as that of an antenna is provided after the PA in addition to the antenna, and it is assumed that a signal is not transmitted to the antenna and is transmitted to the signal termination unit.

Figure 7:
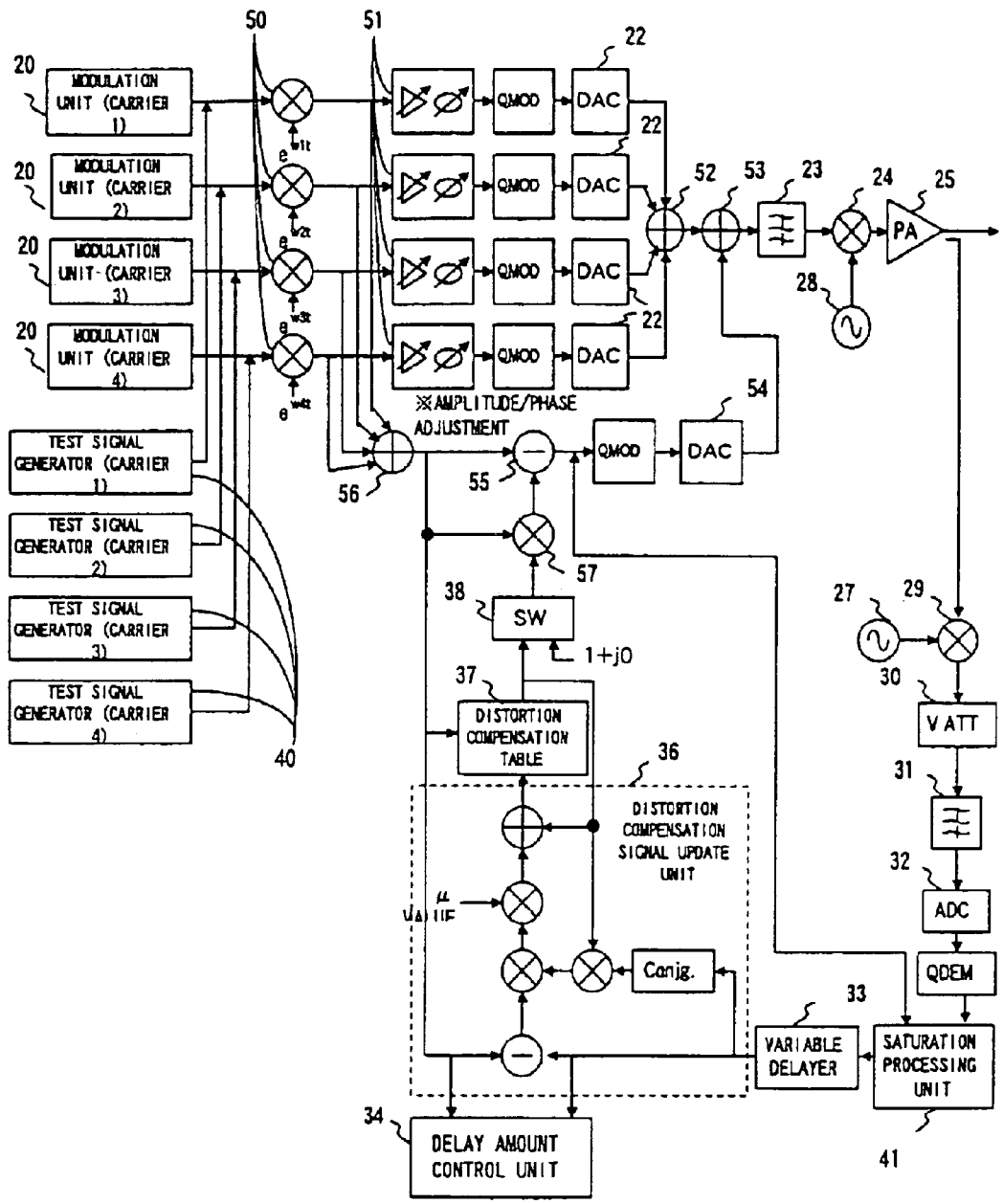
FIG. 7 shows the linearizer configuration in the case where a multi-DAC, which is one of multi-carrier type distortion compensation configurations, is used.

FIG. 7 shows the linearizer configuration in the case where a multi-DAC, which is one of multi-carrier type distortion compensation configurations, is used.

In FIG. 7, the same reference numbers are used for the same constituent elements as those shown in FIG. 4, and the descriptions are omitted here.

In this configuration, since a plurality of DACs 22 are used (for each carrier) and addition is made using an analog signal (adder 52), both amplitude and phase deviations are caused due to the differences in DAC output error generated between each DAC and the adder 52, in analog line length between each DAC and the adder 52, in frequency characteristics of the adder 52, between the four DACs 22. Therefore, both analog delay and phase shift are adjusted by providing an amplitude/phase adjuster 51 before the DAC 22.

Specifically, the phase of a modulation signal outputted from each of modulators 20 for carriers 1 through 4 (not limited to four waves) or a test signal outputted from each of test signal generators 40 for carriers 1 through 4 is shifted by a multiplier 50. All the carrier signals are added in an adder 56. The amplitude and phase of each of the carrier signals are adjusted by the amplitude/phase adjuster 51, each of the carrier signals is QPSK-modulated and the signal is converted into an analog signal from a digital signal by the respective DAC 22.

A distortion compensation value is added to the signal obtained by summing individual signals by an adder 53, and is passed through a bandpass filter 23. Then, the signal is multiplied by a high frequency generated from a local oscillator 28 by a multiplier 24, is amplified by the PA 25 and is transmitted. As described earlier, the distortion compensation coefficient of the PA 25 output is obtained via a feedback route, and is multiplied to the signal obtained by adding the respective carrier signals in a multiplier 57. Furthermore, according to this configuration, a difference signal is generated by a subtracter 55 by subtracting the original signal from the signal after the multiplication of a distortion compensation coefficient, and distortion compensation is made by adding the signal obtained by adding the difference signal to the signal obtained by converting the signal obtained by adding the respective carriers into a digital signal by the DAC 22, in the adder 53 via a DAC 54.

As described earlier, a feedback loop is opened by selecting not a distortion compensation coefficient but 1+j0 in the switch 38.

Figure 8:
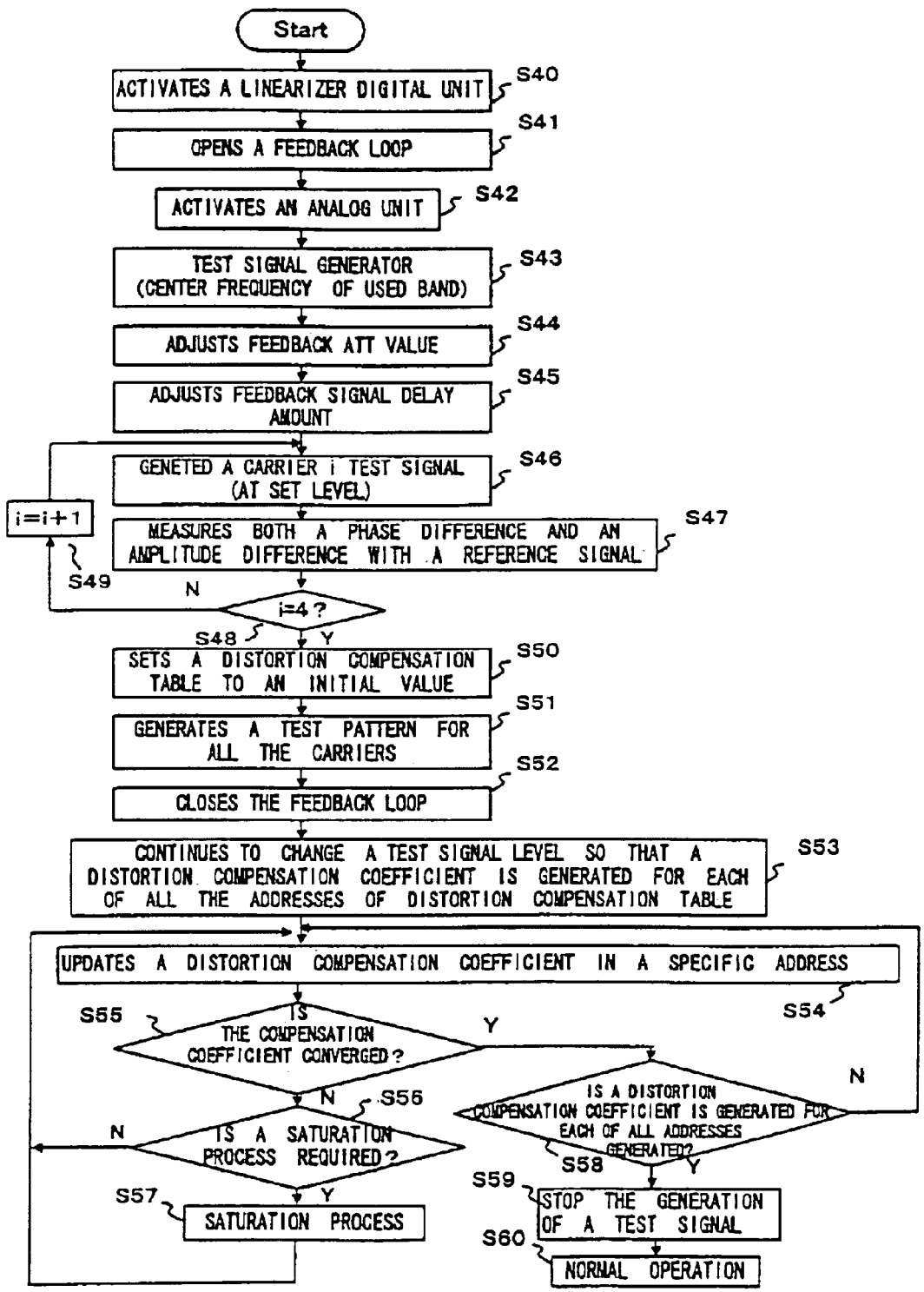
FIG. 8 is a flowchart showing one activation procedure of the configuration shown in FIG. 7.

FIG. 8 is a flowchart showing one activation procedure of the configuration shown in FIG. 7.

In the activation procedure shown in FIG. 8, a routine of measuring both a phase difference and an amplitude difference between a feedback signal and the reference signal for each carrier and eliminating deviations between carriers is added.

First, in step S40, a linearizer digital section is activated and in step S41, a feedback loop is opened. Then, in step S42, an analog section is activated and in step S43, a test signal is generated. A test signal is assumed to have the central frequency of a band in use composed of a plurality of carriers. Then, in step S44, the attenuation value of feedback ATT is adjusted and in step S45, a feedback signal delay amount is adjusted.

Then, in step S46, the test signal of carrier i is generated at a prescribed level and in step S47, both the phase difference and amplitude difference between the reference signal and feedback signal are measured. Then, in step S48 it is judged whether the measurement is made for all the carriers. In this example, it is judged whether the measurement is made for four carriers. If the measurement is not made for all the carriers, in step S49, i is incremented by one. Then, the flow returns to step S46 and the measurement is repeated. If in step S48 it is judged that the measurement is made for all the carriers, the flow proceeds to step S50.

In step S50, a distortion compensation table is set to the initial value and in step S51, a test pattern is generated in all the carriers. Then, in step S52, the feedback loop is closed and a distortion compensation table starts to be generated.

In the generation of a distortion compensation table, in step S53, a test signal level is sequentially changed so that a distortion compensation coefficient is generated for every address of the distortion compensation table. First, in step S54, a distortion compensation coefficient of the distortion compensation table is updated in a specific address, and in step S55 it is judged whether the compensation coefficient is converged. If the compensation is not converged, the flow proceeds to step S56 and it is judged whether a saturation process is required. If a saturation process is not required, the flow returns to step S54. If in step S56 it is judged that a saturation process is required, in step S57 a saturation process is performed and the flow returns to step S54.

If in step S55 it is judged that the compensation coefficient is converged, in step S58 it is judged whether a distortion compensation coefficient is generated for every address. If a distortion compensation coefficient is not generated for every address, the flow proceeds to step S59 and the generation of a test signal is stopped. Then, in step S60, the operation shifts to the normal operation.

Figure 9:
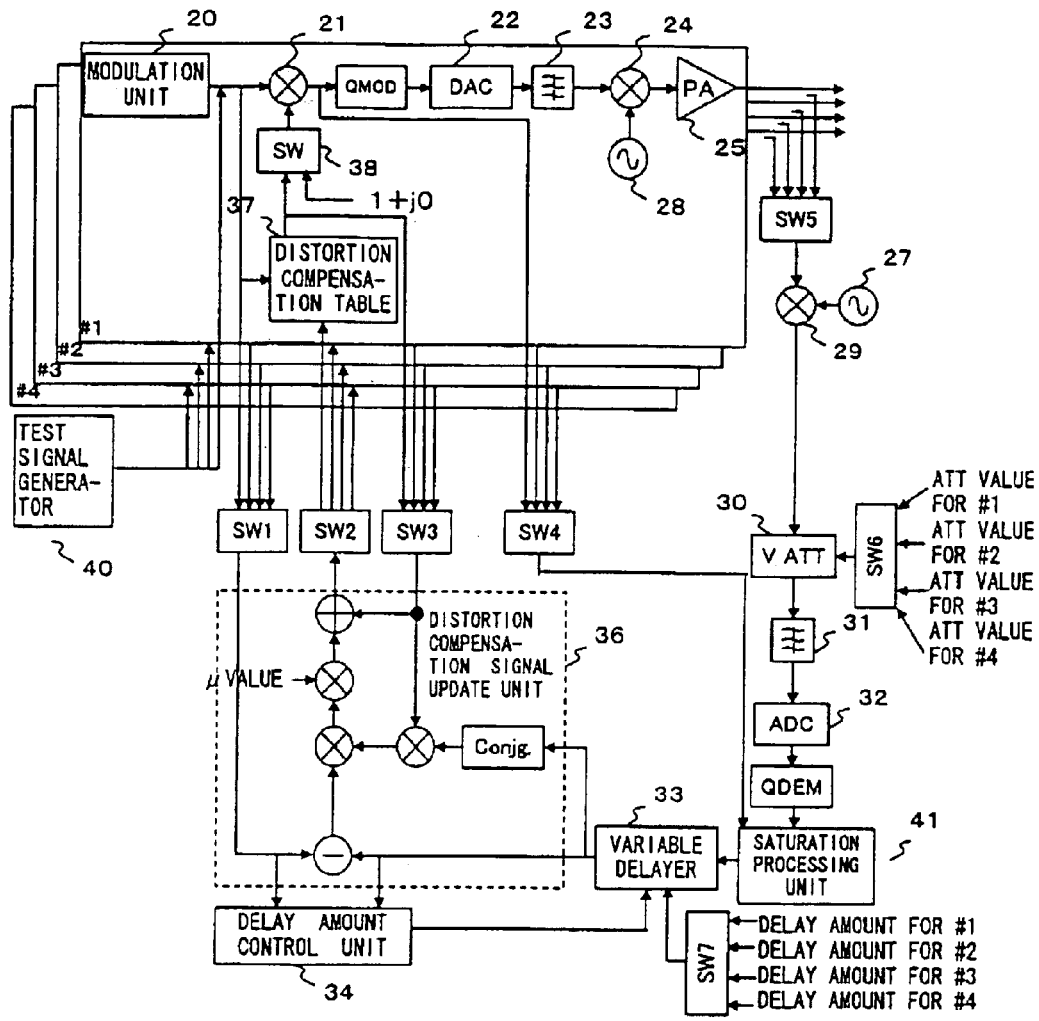
FIG. 9 shows one circuit configuration of a transmitter in order to describe another preferred embodiment of the activation procedure in the preferred embodiment of the present invention.

FIG. 9 shows one circuit configuration of a transmitter in order to describe another preferred embodiment of the activation procedure in the preferred embodiment of the present invention.

The configuration of the preferred embodiment described above comprises one distortion compensation signal update unit and one feedback system for one transmitting forward system. In this configuration, there is no need to always update a distortion compensation coefficient by a distortion compensation signal update unit, and there is no problem if a distortion compensation coefficient is regularly updated at specific intervals. Therefore, as shown in FIG. 9, the scale of circuit configuration can be reduced by using one feedback system and one distortion compensation signal update unit for a set of one linearizer digital section, including a compensation table, and a plurality of transmitting forward systems of an analog section and by switching loops using switches.

In FIG. 9, the same reference numbers are used for the same constitute elements as those shown in FIG. 4 and the descriptions thereof are omitted here.

In the configuration shown in FIG. 9, a plurality of circuits each covering a modulation unit 20 to a PA25 are mounted on a plurality of substrates, feedback routes are shared by these substrates and a distortion compensation table is generated by changing over switches SW1–SW7. In this case, although in FIG. 9 one substrate accommodates the circuits shown in FIG. 4, one substrate can also accommodate the circuits shown in FIG. 7.

In FIG. 9, although the basic configuration is the same as that shown in FIG. 4, switches SW1–SW7 are added. Switches SW1–SW5 are used to update a distortion compensation table 37 provided for each substrate via feedback routes shared by the plurality of substrates by changing over the inputs from and the outputs to a plurality of substrates. Switches SW6 and SW7 are used to provide a corresponding attenuation (ATT value) and delay value stored in a VATT 30 and a variable delayer 33, respectively, to the variable delayer 33 and VATT 30, respectively, by switching the attenuation values and delay values for each substrate to the corresponding attenuation (ATT value) and delay value, respectively, when they operate for a corresponding substrate.

Figure 10:
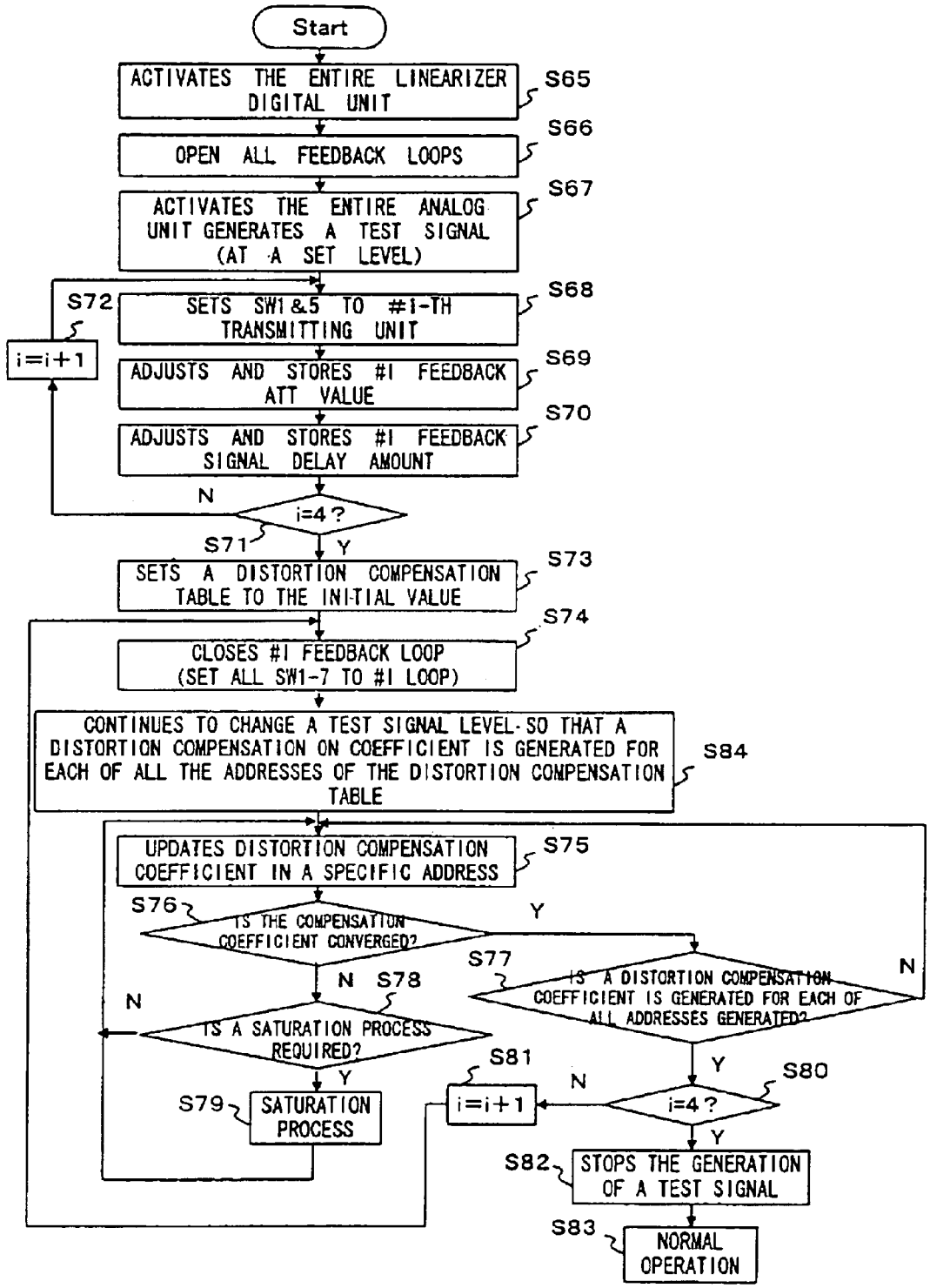
FIG. 10 is a flowchart showing the activation method of the compensation coefficient time-division update configuration shown in FIG. 9.

FIG. 10 is a flowchart showing the activation procedure of the compensation coefficient time-division update configuration shown in FIG. 9.

FIG. 10 shows the activation procedure in the case of four-multiplexing.

Both feedback ATT and a feedback signal delay amount are sequentially adjusted for each transmitting system (#1–4) by changing over switches when a feedback loop is opened. In this case, since there is only one VATT and variable delayer each, the value must be stored after adjustment. A compensation table is also sequentially generated for each transmitting system (#1–4) by changing over loops by switches when the feedback loop is closed.

First, in step S65, the entire linearizer digital section on a substrate is activated and in step S66, all the feedback loops on the substrate are opened. Then, in step S67, the entire analog section is activated and a test signal is generated at a setting level.

Then, in step S68, switches SW1 and SW5 are set to the i-th substrate (transmitting unit) and in step S69, a feedback ATT value corresponding to the i-th substrate is adjusted and the ATT value after adjustment is stored. Then, in step S70, a feedback signal delay amount corresponding to the i-th substrate is adjusted and the delay amount after adjustment is stored. Then, in step S71 it is judged whether the process is performed for all the substrates (in this case, #1–#4). If the process is not performed for all the substrates, i is incremented by one and the flow returns to step S68. If in step S71 it is judged that the process is performed for all the substrates, the flow proceeds to step S73 and the compensation table is set to the initial value.

Then, in step S74, switches SW1–SW7 are set to the i-th substrate, and the feedback loop formed for the i-th substrate is closed. Then, in step S84, a test signal is made variable so that a distortion compensation coefficient is generated for every address of the distortion compensation table and in step S75, the distortion compensation coefficient is updated in a specific address. Then, in step S76 it is judged whether the compensation coefficient is converged. If in step S76 it is not judged that the compensation coefficient is converged, the flow proceeds to step S78 and it is judged whether a saturation process is required. If a process is not required, the flow proceeds to step S75 without any process. If the process is required, in step S79, a saturation process is performed and the flow returns to step S75.

If in step S76 it is judged that the compensation coefficient is converged, in step S77 it is judged whether a distortion compensation coefficient is generated for every address. If a coefficient is not generated for every address, the flow proceeds to step S84. If the coefficient is generated for every address, the flow proceeds to step S80.

In step S80 it is judged whether the process is performed for all the substrates (in this case #1–#4). If the process is not performed for all the addresses, in step S81 the value of i is incremented by one. Then, the flow returns to step S74 and the process is repeated. If it is judged that the process is performed for all the substrates, the flow proceeds to step S82 and the generation of a test signal is stopped. Then, in step S83, the operation shifts to the normal operation.

This activation process assumes that not an antenna but a signal termination unit with the same impedance as that of the antenna is provided after a PA if the device is in an activation process state.

Figure 11:
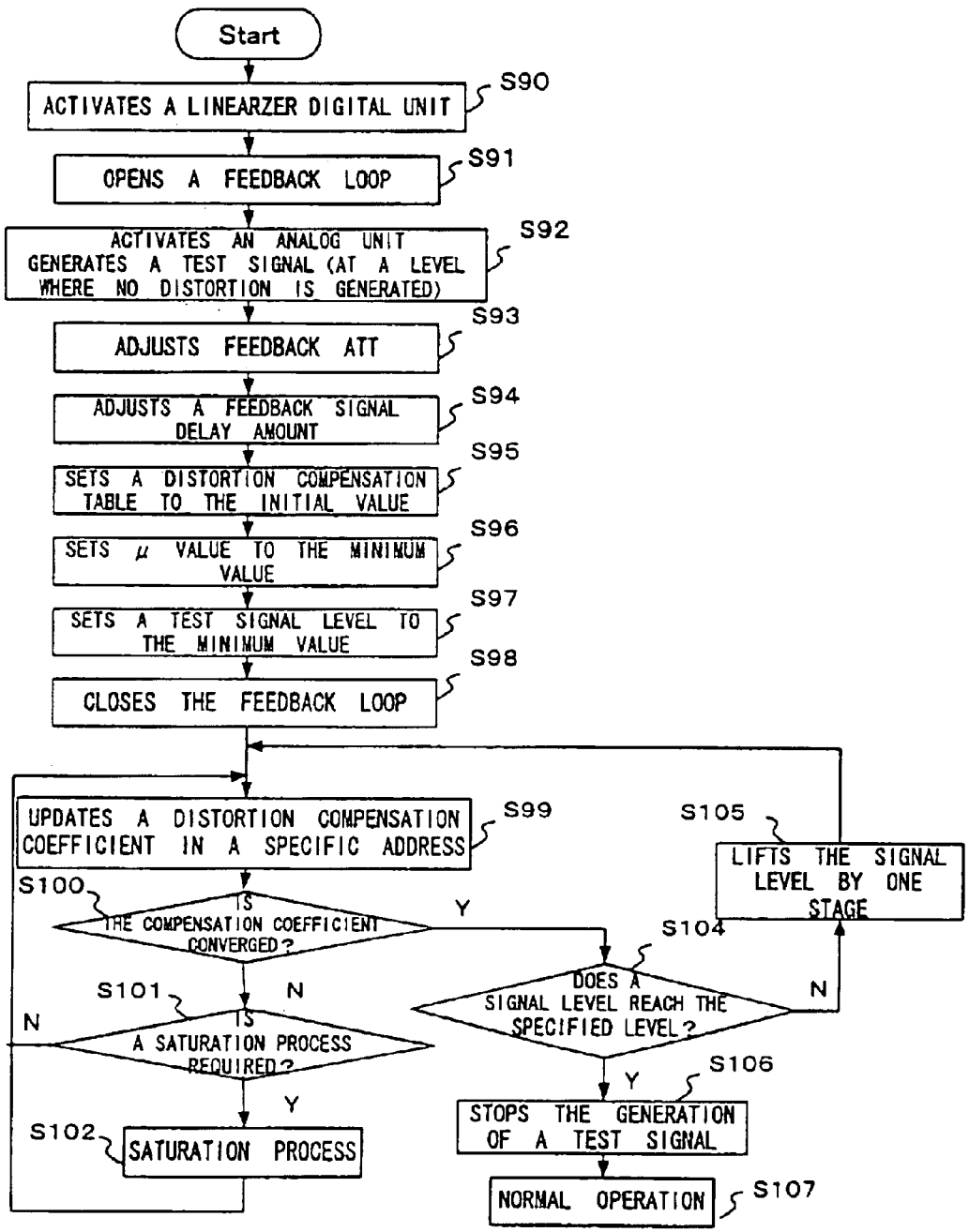
FIG. 11 is a flowchart showing the activation procedure of a transmitting device with a linearizer at a state where an antenna is switched on (state where radio waves can be emitted).

FIG. 11 is a flowchart showing the activation procedure of a transmitting device with a linearizer in a state where an antenna is switched on (state where waves can be emitted).

A point in this case is that a system in an adjacent band should not be affected by emitting a wave with the out-of-band level exceeding the prescribed level. Specifically, since in the generation of a distortion compensation coefficient, a distortion compensation coefficient greatly fluctuates and the non-linear operation of a PA is not guaranteed, distortion is caused in a signal and thereby the spectrum of a signal transmitted from an antenna is spread like a side lobe. Therefore, if another communications system is in operation and the frequency band in use of the system is overlapped with the spectrum spread in a side-lobe shape described above, the communications quality of the other communications system is affected and degraded.

Therefore, in this activation procedure, a distortion compensation coefficient is prevented from radically fluctuating by setting $\mu$ value, which is the update step of the distortion compensation coefficient, to a small value before the feedback loop is closed. When a compensation coefficient is generated, a test signal is also gradually increased from a low level to a high level. In this way, while a feedback loop is open, adjustment is made at a level such that distortion may not occur.

First, in step S90, a linearizer digital section is activated and instep S91, a feedback loop is opened. Then, in step S92, an analog section is activated and a test signal is generated at a level such that distortion may not occur. Then, in step S93, feedback ATT is adjusted and in step S94 a feedback signal delay amount is adjusted. Then, in step S95, a distortion compensation table is set to the initial value. Then, in step S96, $\mu$ value is set to the minimum value and in step S97, a test signal level is set to the minimum level.

Then, in step S98, the feedback loop is closed and in step S99, the distortion compensation coefficient is updated in a specific address. Then, in step S100 it is judged whether the compensation coefficient is converged. If the coefficient is not converged, in step S101 it is judged whether a saturation process is required. If in step S101 it is not judged that a saturation is required, the flow returns to step S99. If in step S101 it is judged that a saturation process is required, in step S102, a saturation process is performed and the flow returns to step S99.

If in step S100 it is judged that the compensation coefficient is converged, the flow proceeds to step S104.

In step S104 it is judged whether a signal level reaches a specified level. If the level does not reach the specified level, in step S105, the signal level is raised by one step and the flow returns to step S99. If in step S104 it is judged that the signal level reaches the specified level, in step S106, the generation of a test signal is stopped and in step S107, the operation shifts to the normal operation.

Although in the flowchart shown in FIG. 11, the activation procedure is described assuming the configuration shown in FIG. 4, the same description can also be applied to the configurations shown in FIGS 7 and 9, which will be able to be easily understood by a person having ordinary skill in the art.

FIGS. 12A and 12B show configurations for making $\mu$ value variable, which is the update step of a distortion compensation coefficient.

In the activation procedure described in the preferred embodiment, $\mu$ value is changed from a large value to a small value (multi-stage change) when a distortion compensation coefficient is generated.

In FIG. 12A, the update step of a distortion compensation coefficient can be made variable by multiplying a coefficient set within a multi-step range of 1–0.00001 to fixed $\mu$ value. Although in FIG. 12A, $\mu$ value is made variable by multiplying a coefficient of 1–0.0001, a different coefficient can also be directly provided. A value of 1–0.0001 is used as an example, and when a system is actually configured, there is a value suitable for the system.

In FIG. 12B, a system is configured in such a way that first, $\mu$ value is made large and is made small in a stage where the compensation coefficient is converged to some degree, that is, in two steps instead of multi-steps. In the case shown in FIG. 12B, both a value obtained by multiplying $\mu$ value by 1 and a value obtained by multiplying value by 0.00001 are prepared and changed over by switches SWs.

Figures 13A, 13B:
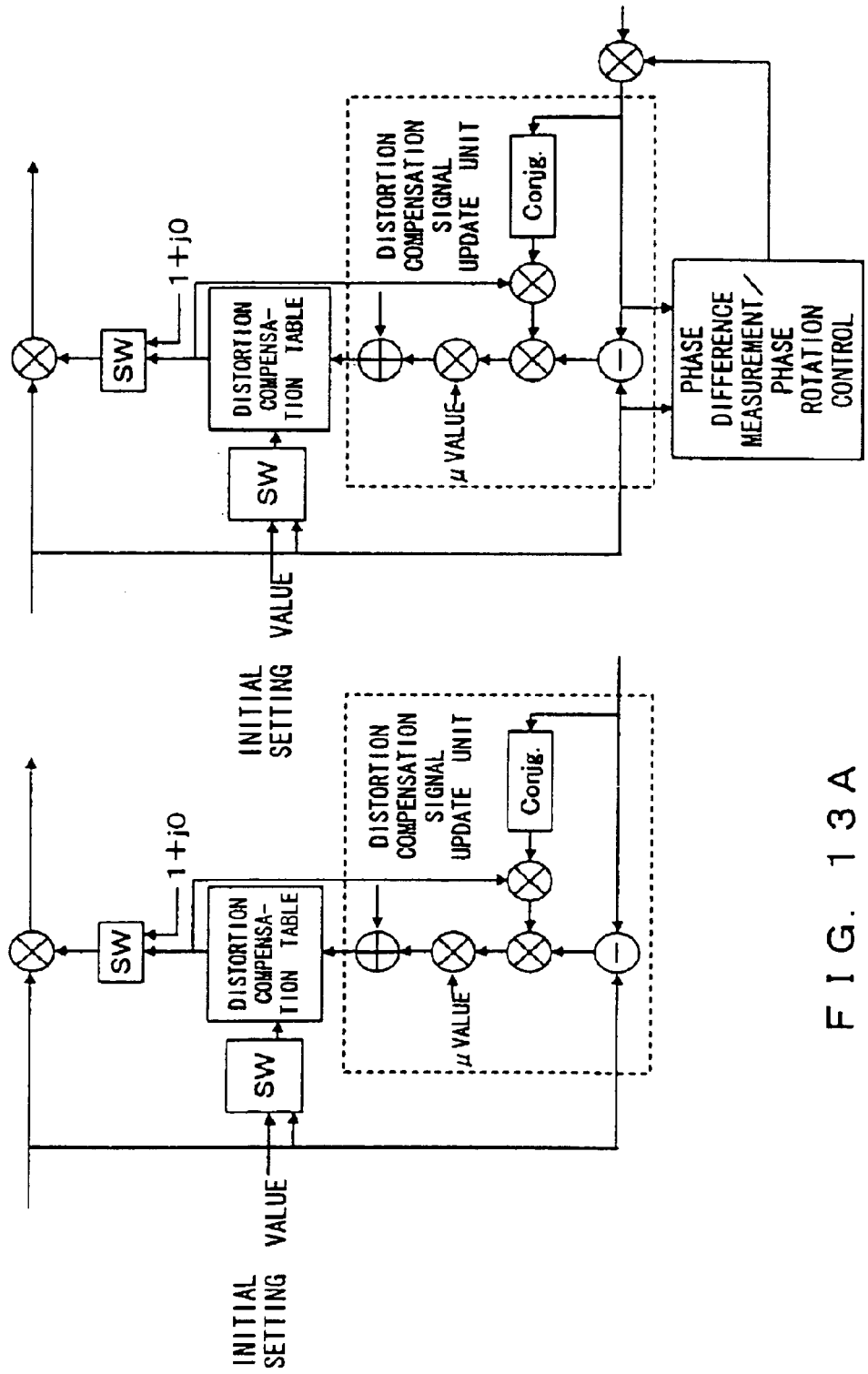
FIG. 13 shows the initial setting of a coefficient value of a distortion compensation table.

FIGS. 13A and 13B show the initial setting of a coefficient value in a distortion compensation table.

Although it is assumed in the description of the preferred embodiment given above that an initial distortion compensation coefficient value is in a complete reset state (1+j0; a signal does not change if this coefficient is multiplied to a signal from a modulator, that is, a signal is predistorted) instead of a reset state, the generation time of a distortion compensation coefficient at the time of activation can also be reduced by loading a compensation coefficient value generated in advance at a plant prior to shipment into a compensation table, as shown in FIG. 13A.

Alternatively, in FIG. 13A, when a distortion compensation coefficient is generated at a plant prior to shipment, the phase rotation degree of both the reference and a feedback signal can be measured in advance, as shown in FIG. 13B. In this case, if the phase rotation degree is measured in the same way prior to the generation of the distortion compensation coefficient after shipment and the same phase rotation degree as that applied when the distortion compensation coefficient is generated prior to shipment is applied, the generation time of a compensation coefficient at the time of activation can be reduced since the phase rotation degree is already reflected on the initial value of the distortion compensation coefficient.

FIG. 14 shows the configuration for judging whether a distortion compensation coefficient is converged.

The convergence of a distortion compensation coefficient is judged by the size of a difference signal, which is the output of the subtracter 35, as shown in FIG. 14. In this case, since a specific convergence threshold value varies depending on the number of bits of a signal of a linearizer digital section, etc., the threshold value cannot be indicated. Specifically, since the decrease in level of the difference signal of the subtracter 35 means that the non-linearity relation between a signal from a modulator or a test signal generator and the output signal of a PA is pretty suppressed, the convergence of a distortion compensation coefficient can be judged by detecting the level of the difference signal in this way.

FIG. 15 shows another configuration for judging whether a distortion compensation coefficient is converged.

The out-of-band signal level of an analog section or linearizer digital section is directly measured, as shown in FIG. 15 and if the level is equal to or less than the prescribed level of the system, the coefficient can be judged to be converged.

Specifically, if a distortion compensation coefficient is not sufficiently converged, the output signal of the PA 25 includes distortion. If the signal includes distortion, the size of a side lobe in the spectrum of the signal, that is, the out-of-band signal level becomes high. Then, a filter 60 extracts this and a power measurement unit 61 measures the power. If the power of the out-of-band signal level becomes small, it means that the distortion of the output signal of the PA 25 is reduced and thereby it means that a distortion compensation coefficient is appropriately set. Therefore, the size of a side lobe in the spectrum of the signal, that is, the out-of-band signal level can be used to judge whether a distortion compensation coefficient is converged.

In this case, a signal is inputted after and before an ADC 63 and a switch 62 changes over after and before an ADC. This does not mean to actually switch it. It indicates that an out-of-band signal level can be measured using an analog signal or the out-of-band signal level can be measured after converting an analog signal into a digital signal. In this case, if an analog signal is used, the filter 60 and power measurement unit 61 comprises an analog filter and an analog power meter, respectively. If a digital signal is used, the filter 60 and power measurement unit 61 comprises a digital filter and a digital power meter, respectively.

Although in the preferred embodiment, it is described to be preferable to use a test signal when an analog level and a delay amount at the time of activation prior to the normal operation are adjusted and when a distortion compensation coefficient is generated, means to be used is not limited to a test signal and an ordinary modulation wave from a modulator can also be used. In this case, it is preferable to attach a test pattern for adjustment to the head of communications data.

FIG. 16 is a flowchart showing the procedure of activating a linearizer from a linearizer-off state.

If communications time is night or a communication area is a light traffic area, an output level is low and there is no need of a linearizer. In such a case, it can be considered to suppress power consumption by switching off a linearizer and to switch on the linearizer again when a high output power is required. In this case, the system is activated in the procedure shown in FIG. 16. In this case, since the system is in communications, the phase and amplitude of a transmitting wave is prevented from suddenly fluctuating when a feedback loop is closed. Therefore, distortion must be prevented from occurring at the time of activation by setting a compensation coefficient to 1+j0 before closing the feedback loop and reducing $\mu$ value to a small value.

In FIG. 16, first, in step S110, a linearizer digital section is activated and in step S111, a feedback loop is opened. Then, in step S112, a feedback ATT value is set to a value obtained before the linearizer is switched off and is finely adjusted. Then, in step S113, a feedback signal delay amount is set to a value obtained before the linearizer is switched off and is finely adjusted. Then, in step S114, the entry of a distortion compensation table is set to 1+j0. Furthermore, in step S115, $\mu$ value is set to the minimum value. Then, in step S116, the feedback loop is closed and in step S117, the distortion compensation table is updated and it is judged whether the update is completed. If in step S117 the update is completed, in step S118, the operation shifts to the normal operation.

This activation procedure can be combined with each activation procedure described earlier, which will be able to be easily understood by a person having ordinary skill in the art.

FIG. 17 shows one configuration, to which a linearizer is applied to a mobile station.

In FIG. 17, the same reference numbers are attached to the constituent elements as those shown in FIGS. 2 and 4, and the descriptions thereof are omitted here.

If a linearizer is applied to a mobile station, the system can be configured using an antenna 26, a termination unit 66 with the same impedance as the antenna and a switch 65 as shown in FIG. 17 that are sized smaller and powered lower than those in a base station, and both each adjustment and the generation of a compensation coefficient can be made possible by terminating a signal at the termination unit 66 instead of outputting radio waves from the antenna 26 before the completion of compensation coefficient update prior to the normal operation at the time of activation. The others are the same as those in the case of the preferred embodiment described above that is based on a base station, and the activation procedure can be obtained by switching the antenna 26 to the termination unit 66 in the first place at the time of linearizer activation and switching back the termination unit 66 to the antenna 26 after the completion of the linearizer activation in addition to the activation procedure described earlier.

Since transmission is not always conducted differently from the case of a base station, by starting a transmitting system for each set time and regularly updating a compensation coefficient in advance, no re-update of the compensation coefficient at the time of the normal transmitting operation is required and thereby the system can quickly enter the normal operation mode.

In a base station too, switching using an antenna, a termination unit with the same impedance as that of the antenna and switches can be made possible. As described earlier, it is preferable to use difference activation procedures for both the case where there is a termination unit and the case where there is no termination unit.

According to the present invention, each unit of a transmitting device with a linearizer can be adjusted and a compensation coefficient can be accurately set. Furthermore, the out-of-band radiation to another system of radio waves, etc., can be suppressed.

What is claimed is:

1. An activation method of a communications apparatus that has both a feedback loop and a non-linear distortion compensation device with a function to generate/update a distortion compensation coefficient, comprising:

(a) opening the feedback loop;

(b) adjusting both a level and a phase of an analog signal of the communications apparatus;

(c) closing the feedback loop; and (d) generating/updating the distortion compensation coefficient;

wherein all coefficients are set to 1+j0 (j is the imaginary unit) as an initial value for said generation/update of a distortion compensation coefficient.

2. The activation method according to claim 1, further comprising:

(e) activating a digital section of said communications apparatus prior to step (a); and (f) activating an analog section of said communications apparatus between steps (a) and (b).

3. The activation method according to claim 1, wherein said step of adjusting the level of an analog signal offsets a gain of an amplifier for amplifying a signal in order to transmit radio waves of said communications apparatus.

4. The activation method according to claim 1, wherein said step of adjusting the phase of an analog signal adjusts an analog signal delay that is caused in the analog section of said communications apparatus and matches in timing a signal transmitted via a feedback loop with a signal directly inputted to said non-linear distortion compensation device.

5. The activation method according to claim 1, wherein said communications apparatus conducts multi-carrier transmission, said activation method, further comprising (g) adjusting both amplitude and phase of a signal for each carrier.

6. The activation method according to claim 5, wherein step (b) is performed using a central frequency of a band occupied by the plurality of carriers as a whole.

7. The activation method according to claim 1, wherein said generation/update of a distortion compensation coefficient is made using a test signal.

8. The activation method according to claim 1, wherein said communications apparatus is composed of a plurality of transmitting systems, forms a feedback loop by sequentially switching the plurality of transmitting systems and generates/updates the distortion compensation coefficient.

9. The activation method according to claim 1, wherein a plurality of generation/update steps of the distortion compensation coefficient can be set.

10. The activation method according to claim 9, wherein the generation/update step of the distortion compensation coefficient is set to a minimum and a level of a signal to be used to generate/update the distortion compensation coefficient is changed in multi-steps from the minimum value and the distortion compensation coefficient is generated/updated by gradually increasing the level.

11. The activation method according to claim 1, wherein a value measured in advance is used as an initial value for said generation/update of a distortion compensation coefficient.

12. The activation method according to claim 1, wherein convergence of a generation/update process of the distortion compensation coefficient is judged by detecting size of a difference signal between a signal directly inputted to said non-linear distortion compensation device and a signal which is transmitted via said feedback loop and the level of which is adjusted.

13. The activation method according to claim 1, wherein convergence of a generation/update process of the distortion compensation coefficient is judged by detecting an out-of-band radiation level of a signal immediately before being transmitted from said transmitting unit.

14. The activation method according to claim 1, wherein if said non-linear distortion compensation device is switched off and is switched on again, a value immediately before said non-linear distortion compensation device is switched off is used as an initial value for said level adjustment and phase adjustment processes in step (b).

15. The activation method according to claim 1, wherein a transmitting side of said communications apparatus comprises an antenna and a signal termination unit with the same impedance as that of the antenna, and generates/updates the distortion compensation coefficient while terminating a signal used to generate/update the distortion compensation coefficient at the signal termination unit.

* * * * *